United States Patent
Miwa

(10) Patent No.: US 8,956,930 B2
(45) Date of Patent: Feb. 17, 2015

(54) PROCESS FOR PRODUCTION OF THIN FILM TRANSISTOR SUBSTRATE

(75) Inventor: Masahiko Miwa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 67 days.

(21) Appl. No.: 13/877,714

(22) PCT Filed: Sep. 29, 2011

(86) PCT No.: PCT/JP2011/005508
§ 371 (c)(1),
(2), (4) Date: Apr. 4, 2013

(87) PCT Pub. No.: WO2012/046421
PCT Pub. Date: Apr. 12, 2012

(65) Prior Publication Data
US 2013/0187162 A1 Jul. 25, 2013

(30) Foreign Application Priority Data
Oct. 6, 2010 (JP) .................................. 2010/226375

(51) Int. Cl.
*H01L 27/12* (2006.01)
*H01L 29/786* (2006.01)
*H01L 21/335* (2006.01)
*G02F 1/1362* (2006.01)
*H01L 29/66* (2006.01)

(52) U.S. Cl.
CPC ...... *G02F 1/136209* (2013.01); *H01L 27/1262* (2013.01); *H01L 27/1288* (2013.01); *H01L 29/66757* (2013.01); *H01L 29/66765* (2013.01); *H01L 29/78627* (2013.01); *H01L 29/78633* (2013.01); *H01L 27/1218* (2013.01)
USPC ................. 438/151; 438/158; 257/59; 257/72

(58) Field of Classification Search
None
See application file for complete search history.

(56) References Cited

FOREIGN PATENT DOCUMENTS

| JP | 63-237033 A | | 10/1988 |
|---|---|---|---|
| JP | H5-19297 A | | 1/1993 |
| JP | 11-121758 A | | 4/1999 |
| JP | 11121758 A | * | 4/1999 |

* cited by examiner

*Primary Examiner* — Julio J Maldonado
*Assistant Examiner* — Molly Reida
(74) *Attorney, Agent, or Firm* — Chen Yoshimura LLP

(57) ABSTRACT

A TFT substrate 50a that includes a transparent substrate 10 and a plurality of TFTs 5a each arranged on the transparent substrate 10 through a base coat film 9 and each having a semiconductor layer 17a, in which the base coat film 9 includes a resin film 11 formed on the transparent substrate 10, and a region of the resin film 11 that overlaps with each of the semiconductor layers 17a has a light-shielding property.

4 Claims, 6 Drawing Sheets

PROCESS FOR PRODUCTION OF THIN FILM TRANSISTOR SUBSTRATE

TECHNICAL FIELD

The present invention relates to a thin film transistor substrate and a manufacturing method therefor, and in particular, relates to a thin film transistor substrate that is used for a display panel such as a liquid crystal display panel and a manufacturing method therefor.

BACKGROUND ART

A liquid crystal display panel is provided with a TFT substrate provided with a thin film transistor (also referred to as a "TFT" below), a pixel electrode, and the like for each sub-pixel, which is the smallest image unit, an opposite substrate provided opposite to the TFT substrate and provided with a common electrode and the like, and a liquid crystal layer sealed between the TFT substrate and the opposite substrate, for example. The liquid crystal display panel is configured to display images by changing the orientation of the liquid crystals in the liquid crystal layer for each sub-pixel by applying a prescribed voltage via each TFT to the liquid crystal layer for each sub-pixel interposed between the pixel electrodes of the TFT substrate and the common electrode of the opposite substrate, and thereby adjusting, for each sub-pixel, the transmittance of light radiated from a backlight provided externally.

In the semiconductor layer from which the TFT is configured, if light from the backlight is incident thereon, for example, then a leakage current is generated in the off state due to photoexcitation, which causes an increase in off current in the TFT. This results in a decrease in display quality in the liquid crystal display panel, and therefore, in the TFT substrate, the semiconductor layer of the TFT needs to be sufficiently shielded from light by a light-shielding layer.

For example, Patent Document 1 discloses exposing the entire surface of a semiconductor active layer to light from a glass substrate side and patterning the semiconductor active layer so as to be self-aligned using a light-shielding film when patterning the semiconductor active layer using photoresist, in a manufacturing method for a liquid crystal display panel provided with an insulating film, a gate electrode, a gate insulating film, and a semiconductor active layer on the light-shielding film, which corresponds to the above-mentioned light-shielding layer.

RELATED ART DOCUMENTS

Patent Documents

Patent Document 1: Japanese Patent Application Laid-Open Publication No. H5-19297

SUMMARY OF THE INVENTION

Problems to be Solved by the Invention

However, because the light-shielding layer for shielding the TFT is often formed of a metal film, there is a risk that due to the potential of the light-shielding layer, TFT properties such as the on current, the off current, and the threshold voltage would change. In particular, if the light-shielding layer is in an electrically floating state, the potential of the light-shielding layer becomes unstable, which causes greater variation in the TFT properties. When maintaining the light-shielding layer at a fixed potential, it is necessary to form contact holes in the insulating film that covers the light-shielding layer, which means that a photolithography step of forming a resist on the insulating film, an etching step of etching parts of the insulating film not covered by the resist, and a removal step of removing the resist are added, for example, which increases the number of manufacturing steps.

The present invention takes into consideration the issues, and an object thereof is to mitigate increases in the off current in a thin film transistor due to light, and mitigating variations in thin film transistor properties while mitigating increases in the number of manufacturing steps.

Means for Solving the Problems

In order to accomplish the above-mentioned object, the present invention is configured such that a region of a resin film, which is formed on a transparent substrate, that overlaps with the semiconductor layer of each thin film transistor has a light-shielding property.

Specifically, the thin film transistor substrate according to the present invention includes: a transparent substrate; and a plurality of thin film transistors provided on the transparent substrate through a base coat film, each of the plurality of thin film transistors having a semiconductor layer, wherein the base coat film includes a resin film formed on the transparent substrate and a region of the resin film overlapping with each semiconductor layer has a light-shielding property.

According to the above configuration, the region of the resin film (constituting at least a portion of the base coat film) formed on the transparent substrate that overlaps with the semiconductor layer of each thin film transistor has a light-shielding property, and thus, it is difficult for light to enter the semiconductor layer of each thin film transistor from the transparent substrate side, which mitigates increases in the off current in the thin film transistor due to light. Also, the part of the resin film that has the light-shielding property in order to mitigate increases in the off current in the thin film transistor due to light is insulating, and not conductive as in conventional examples, which mitigates variation in thin film transistor properties. In addition, the part of the resin film having the light-shielding property in order to mitigate an increase in the off current in the thin film transistor due to light is formed by having the resin film formed on the transparent substrate contain a photosensitive pigment, for example, and radiating light onto the resin film through the semiconductor layer, which mitigates an increase in the number of manufacturing steps due to the fact that photolithography, etching, and removal, which were necessary with conventional examples, are no longer necessary. Therefore, an increase in the off current in the thin film transistor due to light and variations in the thin film transistor properties are mitigated while mitigating an increase in the number of manufacturing steps.

The base coat film may include an inorganic insulating film provided so as to cover the resin film.

According to the above configuration, the base coat film includes an inorganic insulating film provided so as to cover the resin film, and thus, even if there are impurities from the transparent substrate or the resin film, the impurities are blocked by the inorganic insulating film, which mitigates effects on the thin film transistor properties.

Each thin film transistor may be provided with a gate electrode on the base coat film side of the semiconductor layer through a gate insulating film.

According to the above configuration, each thin film transistor is provided with a gate electrode on the base coat film side of the semiconductor layer through a gate insulating film, and thus, specifically a bottom gate thin film transistor is formed.

Each thin film transistor may be provided with a gate electrode on a side of the semiconductor layer opposite to the base coat film through a gate insulating film.

According to the above configuration, each thin film transistor is provided with a gate electrode on the side of the semiconductor layer opposite to the base coat film through a gate insulating film, and thus, specifically a top gate thin film transistor is formed.

A method for manufacturing a thin film transistor substrate provided with a transparent substrate, and a plurality of thin film transistors provided above the transparent substrate through a base coat film, each of the plurality of thin film transistors having a semiconductor layer, includes the steps of: forming, over the transparent substrate, a resin film that will change from having a light-shielding property to being transparent when exposed to light and that constitutes at least a portion of the base coat film; forming the semiconductor layer over the transparent substrate on which the resin film has been formed; radiating the light from above the semiconductor layer onto the resin film to maintain the light-shielding property of the resin film in a region thereof overlapping with the semiconductor layer, and to change other regions of the resin film to be transparent.

According to the above method, the region of the resin film, which is formed on the transparent substrate (constituting at least a portion of the base coat film), that overlaps with the semiconductor layer of each thin film transistor has a light-shielding property, and thus, it is difficult for light to enter the semiconductor layer of each thin film transistor from the transparent substrate side, which mitigates increases in the off current in the thin film transistor due to light. Also, the part of the resin film that has the light-shielding property in order to mitigate increases in the off current in the thin film transistor due to light is insulating, and not conductive as in conventional examples, which mitigates variation in thin film transistor properties. In addition, the part of the resin film having the light-shielding property in order to mitigate an increase in the off current in the thin film transistor due to light is formed by providing the resin film formed on the transparent substrate with photosensitivity and radiating light onto the resin film through the semiconductor layer, which mitigates an increase in the number of manufacturing steps due to the fact that photolithography, etching, and removal, which were necessary with conventional examples, are no longer necessary. Therefore, an increase in the off current in the thin film transistor due to light and variations in the thin film transistor properties are mitigated while mitigating an increase in the number of manufacturing steps.

In the step of forming the resin film, after forming the resin film, an inorganic insulating film may be formed so as to cover the resin film.

According to the above method, in the step of forming the resin film, an inorganic insulating film is formed so as to cover the resin film after forming the resin film, and thus, even if there are impurities from the transparent substrate or the resin film, the impurities are stopped at the inorganic insulating film, which mitigates effects on the thin film transistor properties.

Between the step of forming the resin film and the step of forming the semiconductor layer, a step of forming a gate electrode on the inorganic insulating film and then forming a gate insulating film so as to cover the gate electrode may be included.

According to the above method, a step of forming a gate insulating film so as to cover the gate electrode after forming a gate electrode on the inorganic insulating film is provided between the step of forming the resin film and the step of forming the semiconductor layer, and thus, specifically a bottom gate thin film transistor is made.

In the step of forming the semiconductor layer, the semiconductor layer may be formed on the inorganic insulating film.

According to the above method, in the step of forming the semiconductor layer, the semiconductor layer is formed on the inorganic insulating film, thus specifically forming a top gate thin film transistor.

Effects of the Invention

According to the present invention, the resin film formed on the transparent substrate has a light-shielding property in the region thereof overlapping with the semiconductor layer of each thin film transistor, which can mitigate an increase in the off current in the thin film transistor due to light and mitigate variations in the thin film transistor properties while mitigating increases in the number of manufacturing steps.

DETAILED DESCRIPTION OF EMBODIMENTS

Embodiments of the present invention will be described in detail below based on the drawings. The present invention is not limited to the embodiments below.

Embodiment 1

Figure 1:
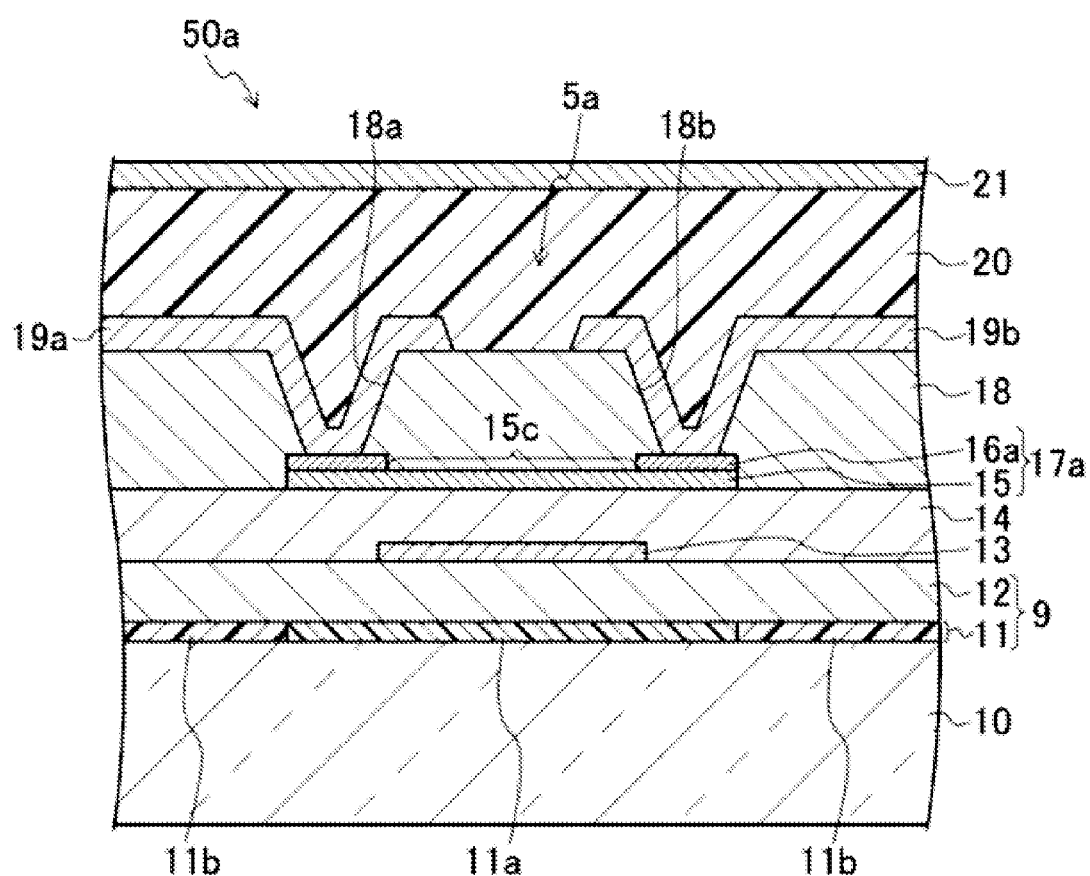
FIG. 1 is a cross-sectional view of a TFT substrate according to Embodiment 1.
Figure 2:
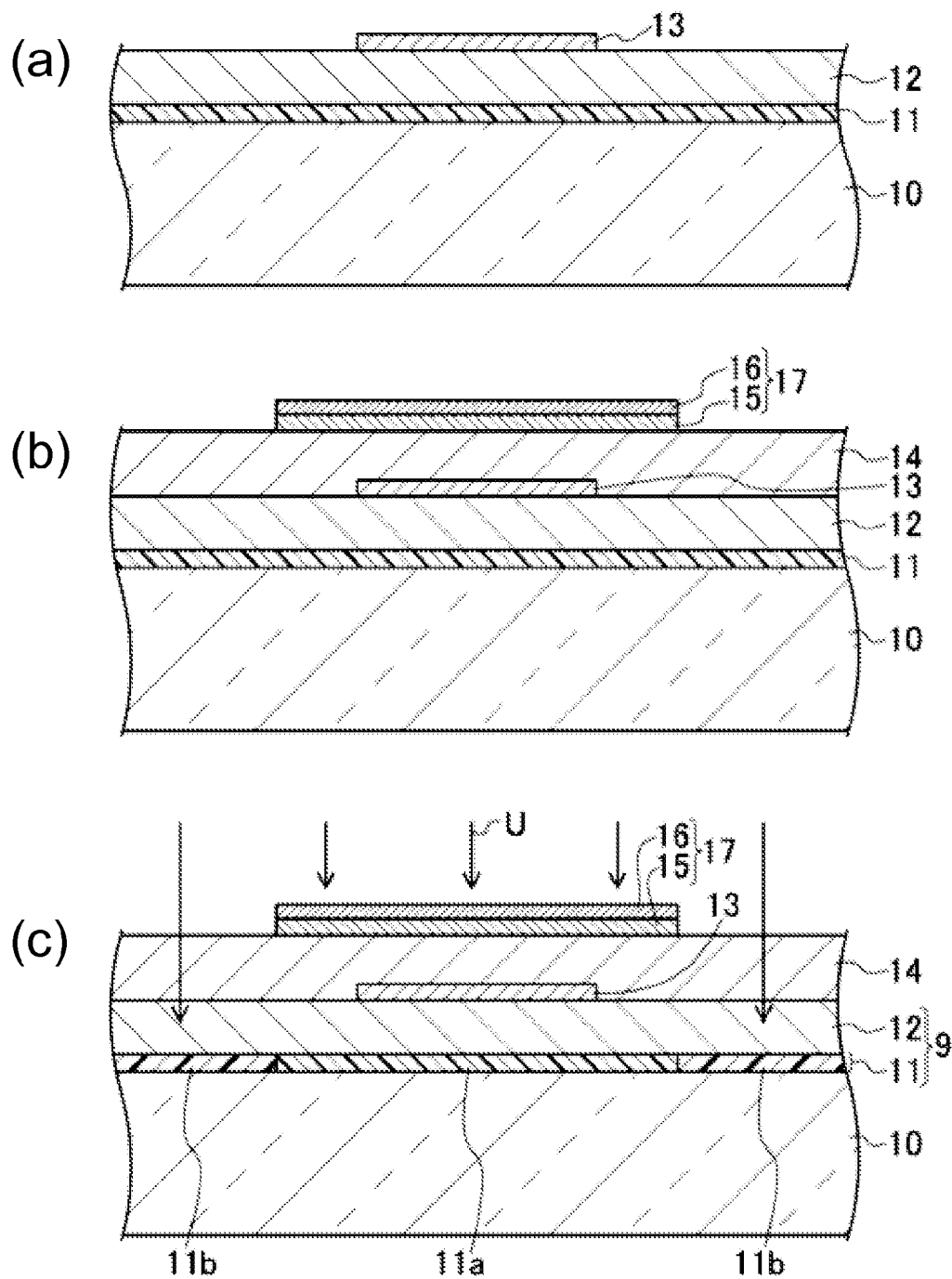
FIG. 2 is a descriptive drawing that shows cross-sections of some manufacturing steps of the TFT substrate of Embodiment 1.

FIGS. 1 and 2 show Embodiment 1 of a TFT substrate and a manufacturing method therefor according to the present invention. Specifically, FIG. 1 is a cross-sectional view of a TFT substrate 50a of the present embodiment.

The TFT substrate 50a, as shown in FIG. 1, is provided with a transparent substrate 10, a base coat film 9 provided on the transparent substrate 10, a plurality of bottom gate TFTs 5a provided above the base coat film 9 for each sub-pixel, a protective film 20 provided so as to cover respective TFTs 5a, and a plurality of pixel electrodes 21 arranged in a matrix on the protective film 20.

The base coat film 9, as shown in FIG. 1, is provided with a resin film 11 provided on the transparent substrate 10 and an inorganic insulating film 12 provided so as to cover the resin film 11.

The resin film 11, as shown in FIG. 1, is provided with a light-shielding region 11a that has a light-shielding property (such that visible light is not transmitted), and transparent regions 11b that are transparent (such that visible light is transmitted).

As shown in FIG. 1, the TFT 5a is provided with a gate electrode 13 provided on the inorganic insulating film 12 that constitutes a portion of the base coat film 9, a gate insulating film 14 provided so as to cover the gate electrode 13, a semiconductor layer 17a provided in an island shape on the gate insulating film 14 so as to overlap with the gate electrode 13 and overlap with the light-shielding region 11a of the resin film 11, an interlayer insulating film 18 provided so as to cover the semiconductor layer 17a, and a source electrode 19a and a drain electrode 19b provided on the interlayer insulating film 18 and disposed so as to face each other at a distance from each other.

A plurality of gate wiring lines (not shown in the drawing) are provided so as to extend in parallel with each other on the inorganic insulating film 12 that constitutes a portion of the base coat film 9, for example, and the gate electrode 13 is a part, which may protrude to a side, of each gate wiring line in each sub-pixel.

As shown in FIG. 1, the semiconductor layer 17a is provided with an intrinsic amorphous silicon layer 15 with a defined channel region 15c, and a pair of $n^+$ amorphous silicon layers 16a, which are provided on the intrinsic amorphous silicon layer 15 and disposed so as to expose the channel region 15c facing each other at a distance from each other.

A plurality of source wiring lines (not shown in the drawing) are provided so as to extend in parallel with each other while intersecting orthogonally with each gate wiring line on the interlayer insulating film 18, for example, and the source electrode 19a is a part, which may protrude to a side, of each source wiring line in each sub-pixel. Also, as shown in FIG. 1, the source electrode 19a is connected to one $n^+$ amorphous silicon layer 16a through a contact hole 18a formed in the interlayer insulating film 18.

As shown in FIG. 1, the drain electrode 19b is connected to the pixel electrode 21 through a contact hole (not shown in the drawing) formed in the protective film 20 and is connected to the other $n^+$ amorphous silicon layer 16a through a contact hole 18b formed in the interlayer insulating film 18.

The TFT substrate 50a, configured as stated above, constitutes a liquid crystal display panel along with an opposite substrate disposed opposite to the TFT substrate 50a and a liquid crystal layer sealed between the two substrates.

Next, a manufacturing method for the TFT substrate 50a of the present embodiment is described with reference to FIG. 2. FIG. 2 is a descriptive drawing that shows cross-sections of some manufacturing steps of the TFT substrate 50a.

First, the resin film 11 is formed by coating a transparent substrate 10 such as a glass substrate or a resin substrate by spin coating or slit coating with a polyimide heat-resistant resin material or the like that includes a positive photosensitive pigment and changes from having a light-shielding property to being transparent by being exposed to light, for example, to a thickness of approximately 300 nm, and then drying the material.

Next, the inorganic insulating film 12 is formed by forming a silicon nitride film, a silicon oxide film, a layered film thereof, or the like by the CVD (chemical vapor deposition) method, for example, to a thickness of approximately 200 nm onto the entire substrate surface where the resin film 11 is already formed.

In addition, after forming a metal film such as a molybdenum film by the sputtering method to a thickness of approximately 300 nm onto the entire substrate where the inorganic insulating film 12 is already formed, for example, photolithography, etching, and resist removal are conducted on the metal film, forming the gate electrode 13 and gate wiring lines (not shown in the drawing), as shown in FIG. 2(a).

Next, the gate insulating film 14 is formed by forming a silicon nitride film, a silicon oxide film, a layered film thereof, or the like to a thickness of approximately 200 nm by the CVD method onto the entire substrate where the gate electrode 13 and the like are already formed, for example.

In addition, after forming a semiconductor layered film on the entire substrate where the gate insulating film 14 is already formed by forming an intrinsic amorphous silicon film (approximately 50 nm in thickness) and an $n^+$ amorphous silicon film (approximately 100 nm in thickness) in this order by the CVD method, for example, photolithography, etching, and resist removal are conducted on the semiconductor layered film, thus forming a semiconductor layer-forming layer 17 constituted of the intrinsic amorphous silicon layer 15 and an $n^+$ amorphous silicon layer-forming layer 16, as shown in FIG. 2(b).

As shown in FIG. 2(c), ultraviolet light U is radiated from above the semiconductor layer-forming layer 17 onto the resin film 11 on the substrate on which the semiconductor layer-forming layer 17 is already formed. With this radiation, the light-shielding property in the region of the resin film 11 overlapping with the semiconductor layer-forming layer 17 is maintained, thus forming the light-shielding region 11a and the transparent region 11b in the resin film 11.

Next, by conducting photolithography, etching, and resist removal on the $n^+$ amorphous silicon layer-forming layer 16 of the semiconductor layer-forming layer 17 on the substrate on which the light-shielding region 11a and the transparent region 11b are already formed, $n^+$ amorphous silicon layers 16a are formed, thereby completing a semiconductor layer 17a.

In addition, after an inorganic insulating film such as a silicon nitride film, a silicon oxide film, or a layered film thereof is formed to a thickness of approximately 700 nm by the CVD method, for example, on the entire surface of the substrate on which the semiconductor layer 17a is already formed, photolithography, etching, and resist removal are conducted on the inorganic insulating film, thus forming an interlayer insulating film 18 provided with contact holes 18a and 18b.

Next, after a metal film in which a titanium film, an aluminum film, a titanium film, and the like are layered in this order is formed to a thickness of approximately 500 nm by sputtering, for example, on the entire surface of the substrate where the interlayer insulating film 18 is already formed, photolithography, etching, and resist removal are conducted on the metal film, thus forming a source electrode 19a, a drain electrode 19b, and source wiring lines (not shown in drawings).

In addition, after the entire substrate where the source electrode 19a and the drain electrode 19b are formed is coated with an acrylic photosensitive resin film to a thickness of approximately 2 µm by spin coating or slit coating, for example, pre-baking, exposure, developing, and post-baking are conducted on the photosensitive resin, thus forming a protective film 20 with a contact hole (not shown in drawings) that reaches each drain electrode 19b.

Lastly, after a transparent conductive film such as an ITO (indium tin oxide) film is formed by sputtering, for example, to a thickness of approximately 100 nm on the entire substrate where the protective film 20 is already formed, photolithography, etching, and resist removal are conducted on the transparent conductive film, thus forming a pixel electrode 21.

The TFT substrate 50a of the present embodiment is formed as stated above.

As described above, according to the TFT substrate 50a and the manufacturing method therefor of the present embodiment, a light-shielding region 11a is formed by providing a light-shielding property to the region of the resin film 11, which constitutes a portion of the base coat film 9 formed on the transparent substrate 10, that overlaps with the semiconductor layer 17a of each TFT 5a, and thus, it is difficult for light to enter the semiconductor layer 17a of each TFT 5a from the side of the transparent substrate 10, which allows an increase in off current in the TFT 5a due to light to be mitigated. Also, the resin film 11 (the part thereof that has the light-shielding property) for mitigating an increase in off current in the TFT 5a due to light has an insulating property, and not a conductive property as in conventional examples, and thus, it is possible to mitigate variations in properties of the TFT 5a. In addition, the light-shielding region 11a of the resin film 11 for mitigating an increase in off current in the TFT 5a due to light is formed by providing photosensitivity to the resin film 11 formed on the transparent substrate 10 and radiating ultraviolet light U onto the resin film 11 from above the semiconductor layer-forming layer 17, and thus, photolithography, etching, and removal, which were necessary in conventional examples, are no longer necessary, thus mitigating an increase in manufacturing steps. Therefore, it is possible to mitigate an increase in off current in the TFT 5a due to light and variations in properties of the TFT 5a while mitigating an increase in manufacturing steps.

Also, according to the TFT substrate 50a of the present embodiment, the base coat film 9 includes the resin film 11 and the inorganic insulating film 12 provided so as to cover the resin film 11, and thus, even if there are impurities from the transparent substrate 10 or the resin film 11, these impurities are blocked by the inorganic insulating film 12, and thus, it is possible to mitigate any effects on the properties of the TFT 5a.

According to the TFT substrate 50a of the present embodiment, the transparent region 11b is provided in the entire outer region of each light-shielding region 11a that shields the semiconductor layer 17a from light, at the same thickness as the light-shielding region 11a, and thus, it is possible to mitigate the occurrence of breakage in the semiconductor layer 17a or the like resulting from a difference in thickness formed by the light-shielding region 11a.

Also, according to a manufacturing method for the TFT substrate 50a of the present embodiment, the light-shielding region 11a of the resin film 11 that shields the semiconductor layer 17a from light is formed so as to be self-aligned, with the semiconductor layer-forming layer 17 as a mask, and thus, it is possible to mitigate misalignment between the semiconductor layer 17a and the light-shielding region 11a of the resin film 11.

Also, according to the manufacturing method for the TFT substrate 50a of the present embodiment, the light-shielding region 11a that shields the semiconductor layer 17a from light is made of resin, and thus, it is possible to form the light-shielding region 11a with a low cost coating device instead of a sputtering device used for forming conventional metal light-shielding layers, and thus, the manufacturing cost can be kept low.

Embodiment 2

Figure 3:
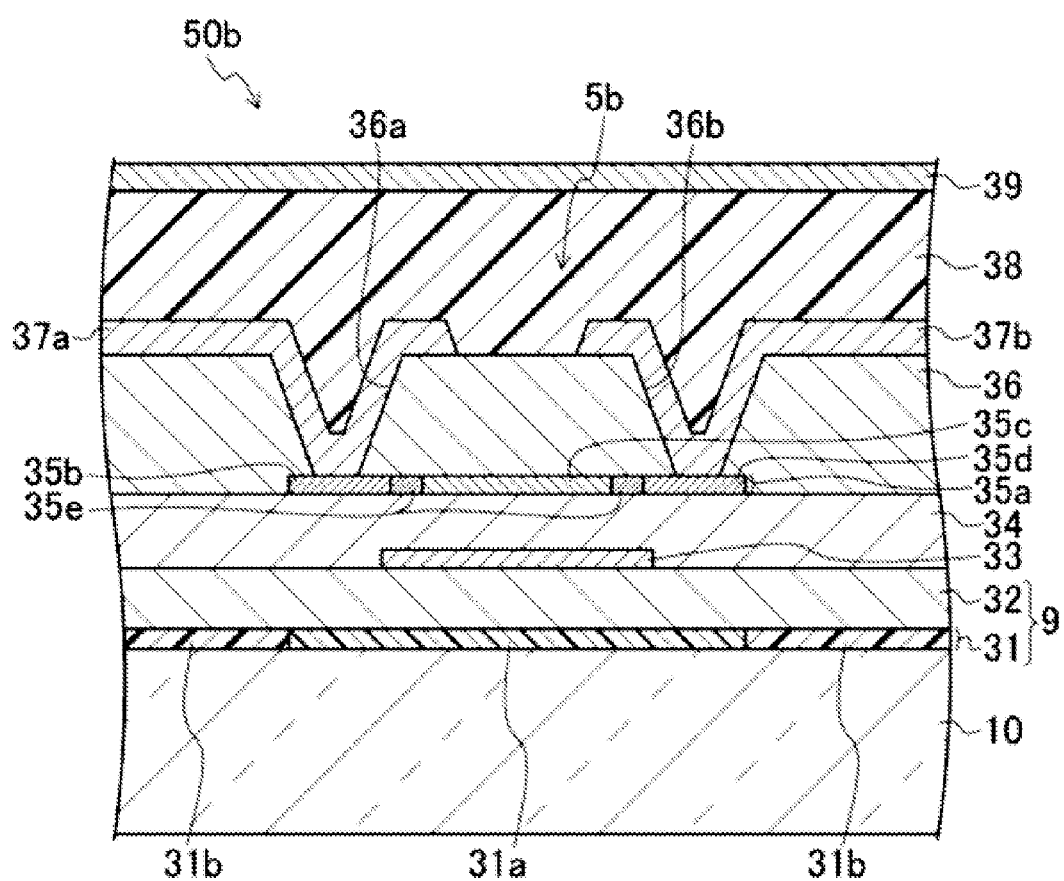
FIG. 3 is a cross-sectional view of a TFT substrate according to Embodiment 2.

FIG. 3 is a cross-sectional view of a TFT substrate 50b of the present embodiment. In each embodiment below, the same reference characters are assigned for parts that are the same as FIGS. 1 and 2, and detailed descriptions thereof are omitted.

In Embodiment 1, the TFT substrate 50a provided with the bottom gate TFTs 5a made of amorphous silicon was shown as an example, but in the present embodiment, a TFT substrate 50b provided with a bottom gate TFTs 5b made of polysilicon through a low temperature process is shown as an example.

Specifically, the TFT substrate 50b, as shown in FIG. 3, is provided with a transparent substrate 10, a base coat film 9 provided on the transparent substrate 10, a plurality of bottom gate TFTs 5b provided above the base coat film 9 for respective sub-pixels, a protective film 38 provided so as to cover the respective TFTs 5b, and a plurality of pixel electrodes 39 arranged in a matrix on the protective film 38.

The base coat film 9, as shown in FIG. 3, is provided with a resin film 31 provided on the transparent substrate 10 and an inorganic insulating film 32 provided so as to cover the resin film 31.

The resin film 31, as shown in FIG. 3, is provided with a light-shielding region 31a that has a light-shielding property, and transparent regions 31b that are transparent.

As shown in FIG. 3, the TFT 5b is provided with a gate electrode 33 provided on the inorganic insulating film 32 that constitutes a portion of the base coat film 9, a gate insulating film 34 provided so as to cover the gate electrode 33, an island-shaped semiconductor layer 35a that is formed on the gate insulating film 34 so as to overlap with the gate electrode 33 and so as to overlap with the light-shielding region 31a of the resin film 31, an interlayer insulating film 36 provided on the semiconductor layer 35a, and a source electrode 37a and a drain electrode 37b provided on the interlayer insulating film 36 and disposed facing each other at a distance from each other.

A plurality of gate wiring lines (not shown in the drawing) are provided so as to extend in parallel with each other on the inorganic insulating film 32 that constitutes a portion of the base coat film 9, for example, and the gate electrode 33 is a part, which may protrude to a side, of a gate wiring line in each sub-pixel.

As shown in FIG. 3, the semiconductor layer 35a is provided with a channel region 35c provided so as to overlap with the gate electrode 33, a source region 35b and a drain region 35d provided facing each other at a distance from each other through the channel region 35c, and a pair of LDD (lightly doped drain) regions 35e provided respectively between the channel region 35c and the source region 35b and between the channel region 35c and the drain region 35d.

A plurality of source wiring lines (not shown in the drawing) are provided so as to extend in parallel with each other while intersecting orthogonally with each gate wiring line on the interlayer insulating film 36, for example, and the source electrode 37a is a part, which may protrude to a side, of a source wiring line in each sub-pixel. Also, as shown in FIG. 3, the source electrode 37a is connected to the source region 35b of the semiconductor layer 35a through a contact hole 36a formed in the interlayer insulating film 36.

As shown in FIG. 3, the drain electrode 37b is connected to the pixel electrode 39 through a contact hole (not shown in drawing) formed in the protective film 38, and is connected to the drain region 35d of the semiconductor layer 35a through the contact hole 36b formed in the interlayer insulating film 36.

The TFT substrate 50b, configured as stated above, constitutes a liquid crystal display panel along with an opposite substrate disposed opposite to the TFT substrate 50b and a liquid crystal layer sealed between the two substrates.

Next, a manufacturing method for the TFT substrate 50b of the present embodiment is described with reference to FIG. 4.

Figure 4:
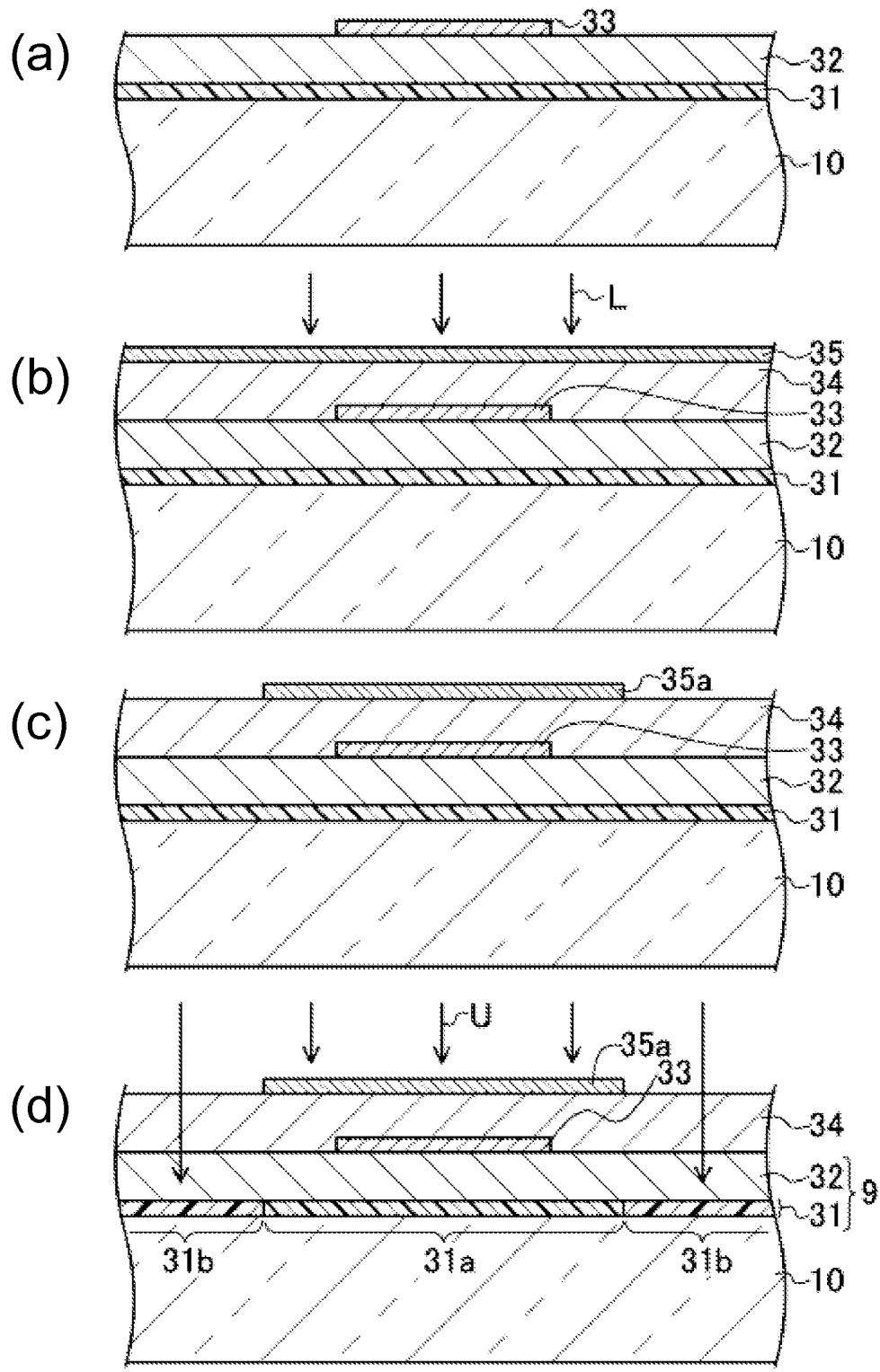
FIG. 4 is a descriptive drawing that shows cross-sections of some manufacturing steps of the TFT substrate of Embodiment 2.

FIG. 4 is a descriptive drawing that shows cross-sections of some manufacturing steps of the TFT substrate 50b.

First, the resin film 31 is formed by coating to a thickness of approximately 300 nm by spin coating or slit coating, for example, a transparent substrate 10 such as a glass substrate or a resin substrate with a polyimide heat-resistant resin material or the like that includes a positive photosensitive pigment so as to change from having a light-shielding property to being transparent by being exposed to light, and then drying the material.

Next, the inorganic insulating film 32 is formed by forming a silicon nitride film, a silicon oxide film, a layered film thereof, or the like to a thickness of approximately 200 nm by the CVD method, for example, onto the entire substrate where the resin film 31 is already formed.

In addition, after forming a metal film such as a molybdenum film to a thickness of approximately 300 nm by the sputtering method, for example, onto the entire substrate where the inorganic insulating film 32 is already formed, photolithography, etching, and resist removal are conducted on the metal film, thus forming a gate electrode 33 and gate wiring lines (not shown in drawing) as shown in FIG. 4(a).

Next, the gate insulating film 34 is formed by forming a silicon nitride film, a silicon oxide film, a layered film thereof, or the like to a thickness of approximately 100 nm by the CVD method, for example, onto the entire substrate where the gate electrode 33 and the like are already formed.

In addition, after an intrinsic amorphous silicon film 35 is formed to a thickness of approximately 50 nm by the CVD method, for example, onto the entire substrate where the gate insulating film 34 is already formed, the intrinsic amorphous silicon film 35 is crystalized by radiating a laser beam L onto the intrinsic amorphous silicon film 35 as shown in FIG. 4(b), thus forming a polysilicon film.

Then, photolithography, etching, and resist removal are conducted on the polysilicon film formed as stated above, and as shown in FIG. 4(c), a semiconductor layer 35a is formed.

Then, as shown in FIG. 4(d), ultraviolet light U is radiated from above the semiconductor layer 35a onto the resin film 31 on the substrate on which the semiconductor layer 35a is formed. With this radiation, the light-shielding property in the region of the resin film 31 overlapping with the semiconductor layer 35a is maintained, thus forming a light-shielding region 31a and transparent regions 31b in the resin film 31.

Next, impurities are appropriately injected into the semiconductor layer 35a using a resist (not shown in drawing), thus forming the channel region 35c, the source region 35b, the drain region 35d, and the LDD regions 35e.

In addition, after an inorganic insulating film such as a silicon nitride film, a silicon oxide film, or a layered film thereof is formed to a thickness of approximately 700 nm by the CVD method, for example, onto the entire surface of the substrate on which the channel region 35c, the source region 35b, the drain region 35d, and the LDD regions 35e are already formed, photolithography, etching, and resist removal are conducted on the inorganic insulating film, thus forming an interlayer insulating film 36 provided with contact holes 36a and 36b.

Next, after forming a metal film in which a titanium film, an aluminum film, a titanium film, and the like are layered in this order by the sputtering method, for example, to a thickness of approximately 500 nm onto an entire substrate where the interlayer insulating film 36 is already formed, photolithography, etching, and resist removal are conducted on the metal film, thus forming a source electrode 37a, a drain electrode 37b, and source wiring lines (not shown in drawing).

In addition, after the entire substrate on which the source electrode 37a, the drain electrode 37b, and the like are already formed is coated by spin coating or slit coating, for example, with an acrylic photosensitive resin film to a thickness of approximately 2 μm, pre-baking, exposure, developing, and post-baking are conducted on the photosensitive resin, thus forming a protective film 38 provided with a contact hole (not shown in drawing) that reaches each drain electrode 37b.

Lastly, after forming a transparent conductive film such as an ITO film by the sputtering method, for example, to a thickness of approximately 100 nm onto the entire substrate on which the protective film 38 is already formed, photolithography, etching, and resist removal are conducted on the transparent conductive film, thus forming a pixel electrode 39.

The TFT substrate 50b of the present embodiment is manufactured as stated above.

As described above, according to the TFT substrate 50b and the manufacturing method therefor of the present embodiment, the light-shielding region 31a is formed by providing a light-shielding property to a region of the resin film 31, which constitutes a portion of the base coat film 9 formed on the transparent substrate 10, that overlaps with the semiconductor layer 35a of each TFT 5b. Therefore, it is difficult for light to enter the semiconductor layer 35a of each TFT 5b from the side of the transparent substrate 10, thus mitigating an increase in off current in the TFT 5b due to light. Also, the resin film 31 (the part thereof that has the light-shielding property) for mitigating an increase in off current in the TFT 5b due to light has an insulating property, and not a conductive property as in conventional examples, and thus, it is possible to mitigate variations in properties of the TFT 5b. In addition, the light-shielding region 31a of the resin film 31 for mitigating an increase in off current in the TFT 5b due to light is formed by providing photosensitivity to the resin film 31 formed on the transparent substrate 10 and radiating ultraviolet light U onto the resin film 31 from above the semiconductor layer 35a, which means that photolithography, etching, and removal, which were necessary in conventional examples, are no longer necessary, thus allowing an increase in manufacturing steps to be mitigated. Therefore, it is possible to mitigate increase in off current in the TFT 5b due to light and variations in properties of the TFT 5b while mitigating an increase in manufacturing steps.

Also, according to the TFT substrate 50b of the present embodiment, the base coat film 9 includes the resin film 31 and the inorganic insulating film 32 provided so as to cover the resin film 31, and therefore, even if there are impurities from the transparent substrate 10 or the resin film 31, the impurities are blocked by the inorganic insulating film 32, thus mitigating effects on the properties of the TFT 5b.

According to the TFT substrate 50b of the present embodiment, the transparent regions 31b are provided in the entire outer region of each light-shielding region 31a that shields the semiconductor layer 35a from light, at the same thickness as the light-shielding region 31a, and thus, it is possible to mitigate the occurrence of breakage in the semiconductor layer 35a or the like resulting from a difference in thickness formed by the light-shielding region 31a.

Also, according to the manufacturing method for the TFT substrate 50b of the present embodiment, the light-shielding region 31a of the resin film 31 that shields the semiconductor layer 35a from light is formed so as to be self-aligned with the semiconductor layer 35a as a mask, and therefore, it is possible to mitigate misalignment between the semiconductor layer 35a and the light-shielding region 31a of the resin film 31.

Also, according to the manufacturing method of the TFT substrate 50b of the present embodiment, the light-shielding region 31a that shields the semiconductor layer 35a from light is made of resin, and is made using a low cost coating device and not a sputtering device used for forming conventional metal light-shielding layers, and thus, manufacturing costs can be kept low.

Embodiment 3

Figure 5:
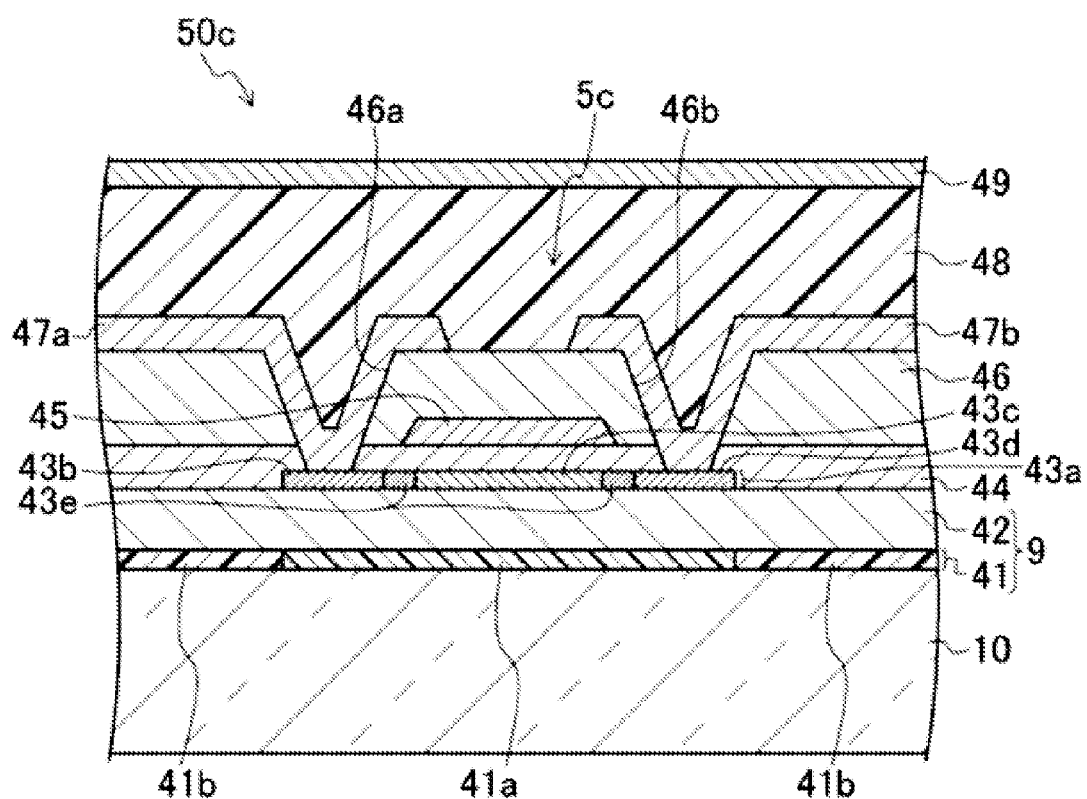
FIG. 5 is a cross-sectional view of a TFT substrate according to Embodiment 3.

FIG. 5 is a cross-sectional view of a TFT substrate 50c of the present embodiment.

In Embodiments 1 and 2, the TFT substrates 50a and 50b provided with bottom gate TFTs 5a and 5b were shown as examples, but in the present embodiment, a TFT substrate 50c provided with top gate TFTs 5c will be shown.

Specifically, as shown in FIG. 5, the TFT substrate 50c is provided with a transparent substrate 10, a base coat film 9 provided on the transparent substrate 10, a plurality of top gate TFTs 5c provided on the base coat film 9 for respective sub-pixels, a protective film 48 provided so as to cover the respective TFTs 5c, and a plurality of pixel electrodes 49 provided in a matrix on the protective film 48.

The base coat film 9, as shown in FIG. 5, is provided with a resin film 41 provided on the transparent substrate 10 and an inorganic insulating film 42 provided so as to cover the resin film 41.

The resin film 41, as shown in FIG. 5, is provided with a light-shielding region 41a that has a light-shielding property, and a transparent region 41b that is transparent.

As shown in FIG. 5, the TFT 5c is provided with a semiconductor layer 43a provided in an island shape so as to overlap with the light-shielding region 41a of the resin film 41 on the inorganic insulating film 42 that constitutes a portion of the base coat film 9, a gate insulating film 44 provided so as to cover the semiconductor layer 43a, a gate electrode 45 provided on the gate insulating film 44 so as to overlap with the semiconductor layer 43a, an interlayer insulating film 46 provided so as to cover the gate electrode 45, and a source electrode 47a and a drain electrode 47b provided on the interlayer insulating film 46 and disposed facing each other at a distance from each other.

As shown in FIG. 5, the semiconductor layer 43a is provided with a channel region 43c provided so as to overlap with the gate electrode 45, a source region 43b and a drain region 43d provided at a distance from each other and facing each other through the channel region 43c, and a pair of LDD regions 43e provided respectively between the channel region 43c and the source region 43b and the channel region 43c and the drain region 43d.

A plurality of gate wiring lines (not shown in the drawing) are provided so as to extend in parallel to each other on the gate insulating film 44, for example, and the gate electrode 45 is a part, which may protrude to a side, of a gate wiring line in each sub-pixel.

A plurality of source wiring lines (not shown in the drawing) are provided so as to extend in parallel with each other while intersecting orthogonally with each gate wiring line on the interlayer insulating film 46, for example, the source electrode 47a is a part, which may protrude to a side, of a source wiring line in each sub-pixel. Also, as shown in FIG. 5, the source electrode 47a is connected to the source region 43b of the semiconductor layer 43a through a contact hole 46a formed in the interlayer insulating film 46.

As shown in FIG. 5, the drain electrode 47b is connected to the pixel electrode 49 through a contact hole (not shown in the drawing) formed in the protective film 48, and is connected to the drain region 43d of the semiconductor layer 43a through the contact hole 46b formed in the interlayer insulating film 46.

The TFT substrate 50c, configured as stated above, constitutes a liquid crystal display panel along with an opposite substrate disposed opposite to the TFT substrate 50c and a liquid crystal layer sealed between the two substrates.

Figure 6:
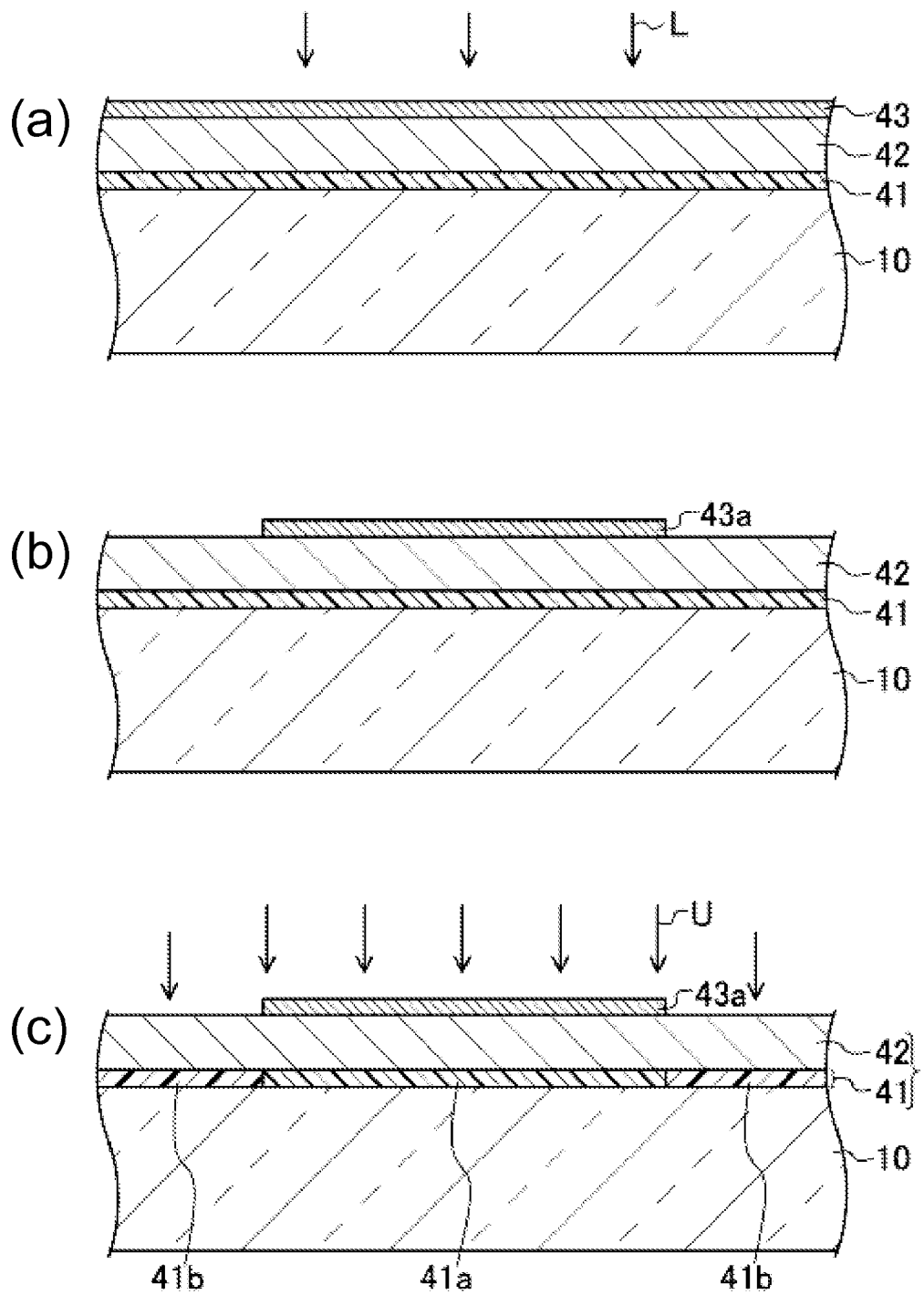
FIG. 6 is a descriptive drawing that shows cross-sections of some manufacturing steps of the TFT substrate of Embodiment 3.

Next, a manufacturing method for the TFT substrate 50c of the present embodiment is described with reference to FIG. 6. FIG. 6 is a descriptive drawing that shows cross-sections of some manufacturing steps of the TFT substrate 50c.

First, the resin film 41 is formed by coating a transparent substrate 10 such as a glass substrate or a resin substrate by spin coating or slit coating to a thickness of approximately 300 nm, for example, with a polyimide heat-resistant resin material or the like that includes a positive photosensitive pigment and changes from having a light-shielding property to being transparent by being exposed to light, and then drying the material.

Next, the inorganic insulating film 42 is formed by forming a silicon nitride film, a silicon oxide film, a layered film thereof, or the like by the CVD method, for example, to a thickness of approximately 200 nm onto the entire substrate where the resin film 41 is already formed.

In addition, after an intrinsic amorphous silicon film 43 is formed to a thickness of approximately 50 nm by the CVD method, for example, onto the entire substrate where the inorganic insulating film 42 is already formed, the intrinsic amorphous silicon film 43 is crystalized by radiating a laser beam L onto the intrinsic amorphous silicon film 43 as shown in FIG. 6(a), thus forming a polysilicon film.

Then, photolithography, etching, and resist removal are conducted on the polysilicon film formed as stated above, and as shown in FIG. 6(b), a semiconductor layer 43a is formed.

Then, as shown in FIG. 6(c), ultraviolet light U is radiated from above the semiconductor layer 43a onto the resin film 41 on the substrate where the semiconductor layer 43a is formed. With this radiation, the light-shielding property in the region of the resin film 41 overlapping with the semiconductor layer 43a is maintained, thus forming a light-shielding region 41a and a transparent region 41b in the resin film 41.

Next, the gate insulating film 44 is formed by forming a silicon nitride film, a silicon oxide film, a layered film thereof, or the like by the CVD method, for example, to a thickness of approximately 100 nm onto the entire substrate where the light-shielding region 41a and the transparent region 41b are already formed.

In addition, by appropriately injecting impurities using a resist (not shown in drawing) into the semiconductor layer 43a on the substrate where the gate insulating film 44 is formed, the channel region 43c, the source region 43b, the drain region 43d, and the LDD regions 43e are formed.

Then, after a metal film such as a molybdenum film is formed at a thickness of approximately 300 nm by the sputtering method, for example, onto the entire substrate where the channel region 43c, the source region 43b, the drain region 43d, and the LDD regions 43e are already formed, photolithography, etching, and resist removal are conducted on the metal film, thus forming the gate electrode 45 and gate wiring lines (not shown in drawing).

Next, after an inorganic insulating film such as a silicon nitride film, a silicon oxide film, or a layered film thereof is formed to a thickness of approximately 700 nm by the CVD method, for example, onto the entire substrate on which the gate electrode 45 and the like are already formed, photolithography, etching, and resist removal are conducted on the inorganic insulating film, thus forming an interlayer insulating film 46 provided with contact holes 46a and 46b, and etching is conducted on the gate insulating film 44 exposed by the contact holes 46a and 46b.

Next, after forming a metal film in which a titanium film, an aluminum film, a titanium film, and the like are layered in this order by the sputtering method, for example, to a thickness of approximately 500 nm onto an entire substrate where the interlayer insulating film 46 is already formed, photolithography, etching, and resist removal are conducted on the metal film, thus forming a source electrode 47a, a drain electrode 47b, and source wiring lines (not shown in drawing).

In addition, after coating the entire substrate where the source electrode 47a, the drain electrode 47b, and the like are already formed with an acrylic photosensitive resin film to a thickness of approximately 2 μm, by spin coating or slit coating, for example, pre-baking, exposure, developing, and post-baking are conducted on the photosensitive resin, thus forming a protective film 48 provided with a contact hole (not shown in drawing) that reaches each drain electrode 47b.

Lastly, after a transparent conductive film such as an ITO film is formed to a thickness of approximately 100 nm by the sputtering method, for example, onto the entire substrate where the protective film 48 is already formed, photolithography, etching, and resist removal are conducted on the transparent conductive film, thus forming the pixel electrode 49.

The TFT substrate 50c of the present embodiment can be manufactured as stated above.

As described above, according to the TFT substrate 50c and the manufacturing method therefor of the present embodiment, the light-shielding region 41a is formed by providing a light-shielding property to regions of the resin film 41, which constitutes a portion of the base coat film 9 formed on the transparent substrate 10, overlapping with the semiconductor layer 43a of each TFT 5c. This makes it difficult for light to enter the semiconductor layer 43a of each TFT 5c from the transparent substrate 10 side, thus mitigating an increase in off current in the TFT 5c due to light. Also, the resin film 41 (the part thereof that has the light-shielding property) for mitigating an increase in off current in the TFT 5c due to light has an insulating property, and not a conductive property as in conventional examples, and thus, it is possible to mitigate variations in properties of the TFT 5c. In addition, the light-shielding region 41a of the resin film 41 for mitigating an increase in off current in the TFT 5c due to light is formed by providing the resin film 41 formed on the transparent substrate 10 with photosensitivity and radiating ultraviolet light U from above the semiconductor layer 43a onto the resin film 41, which means that photolithography, etching, and removal, which were necessary for conventional examples, are no longer necessary, thus mitigating an increase in manufacturing steps. Therefore, it is possible to mitigate an increase in off current in the TFT 5c due to light and variations in properties of the TFT 5c while mitigating an increase in manufacturing steps.

According to the TFT substrate 50c of the present embodiment, the base coat film 9 includes the resin film 41 and the inorganic insulating film 42 provided so as to cover the resin film 41, and thus, even if there are impurities from the transparent substrate 10 and the resin film 41, the impurities are blocked by the inorganic insulating film 42, thus mitigating effects on the properties of the TFT 5c.

Also, according to the TFT substrate 50c of the present embodiment, the transparent regions 41b are provided in the entire outer region of each light-shielding region 41a that shields the semiconductor layer 43a from light, at the same thickness as the light-shielding region 41a, and thus, it is possible to mitigate the occurrence of breakage in the semiconductor layer 43a or the like resulting from a difference in thickness formed by the light-shielding region 41a.

Also, according to the manufacturing method of the TFT substrate 50c of the present embodiment, the light-shielding region 41a of the resin film 41 that shields the semiconductor layer 43a from light is formed so as to be self-aligned with the semiconductor layer 43a as a mask, and thus, it is possible to mitigate misalignment between the semiconductor layer 43a and the light-shielding region 41a of the resin film 41.

Also, according to the manufacturing method of the TFT substrate 50c of the present embodiment, the light-shielding region 41a that shields the semiconductor layer 43a from light is made of resin, and is made using a low cost coating device, and not a sputtering device used for forming conventional metal light-shielding layers, and thus, the manufacturing cost can be kept low.

In the above-mentioned embodiments, a two-layer base coat film having a resin film and an inorganic insulating film layered on the resin film was shown as an example, but when there is no need to take into consideration impurities from the transparent substrate where the resin film is formed and the resin film, the inorganic insulating film may be omitted and a one-layered base coat film having only a resin film may be used.

Also, in the above-mentioned embodiments, a TFT substrate in which the TFT electrode connected to a pixel electrode is used as a drain electrode was shown as an example, but the present invention can be applied to a TFT substrate in which the TFT electrode connected to the pixel electrode is a source electrode.

INDUSTRIAL APPLICABILITY

As described above, the present invention can mitigate an increase in off current in the TFT due to light, and variations in the TFT properties, while mitigating an increase in manufacturing steps, and thus, is applicable as a TFT substrate and a display device provided therewith.

DESCRIPTION OF REFERENCE CHARACTERS

U ultraviolet light
5a to 5c TFT
9 base coat film
10 transparent substrate
11, 31, 41 resin film
12, 32, 42 inorganic insulating film
13, 33, 45 gate electrode
14, 34, 44 gate insulating film
17 semiconductor layer-forming layer (semiconductor layer)
17a, 35a, 43a semiconductor layer
50a to 50c TFT substrate

The invention claimed is:
1. A method for manufacturing a thin film transistor substrate provided with a transparent substrate, and a plurality of thin film transistors provided over the transparent substrate through a base coat film, each of the plurality of thin film transistors having a semiconductor layer, the method comprising:
forming, over the transparent substrate, a resin film that will change from having a light-shielding property to being transparent when exposed to light and that constitutes at least a portion of the base coat film;
forming the semiconductor layer over the transparent substrate on which the resin film has been formed; and radiating the light from above the semiconductor layer onto the resin film to maintain the light-shielding property of the resin film in a region thereof overlapping with the semiconductor layer, and to change other regions of the resin film to be transparent.

2. The method for manufacturing the thin film transistor substrate according to claim 1,
wherein, in the step of forming the resin film, after forming the resin film, an inorganic insulating film is formed so as to cover the resin film.

3. The method for manufacturing the thin film transistor substrate according to claim 2, further comprising, between the step of forming the resin film and the step of forming the semiconductor layer, a step of forming a gate electrode on the inorganic insulating film and then forming a gate insulating film so as to cover the gate electrode.

4. The method for manufacturing the thin film transistor substrate according to claim 2,
wherein, in the step of forming the semiconductor layer, the semiconductor layer is formed on the inorganic insulating film.

* * * * *